United States Patent
Cherkauer et al.

(10) Patent No.: US 6,697,929 B1
(45) Date of Patent: Feb. 24, 2004

(54) SCANNABLE ZERO-CATCHER AND ONE-CATCHER CIRCUITS FOR REDUCED CLOCK LOADING AND POWER DISSIPATION

(75) Inventors: Brian S. Cherkauer, Santa Clara, CA (US); Samuel D. Naffziger, Fort Collins, CO (US)

(73) Assignee: Intel Corporation, Santa Clara, CA (US)

(*) Notice: Subject to any disclaimer, the term of this patent is extended or adjusted under 35 U.S.C. 154(b) by 0 days.

(21) Appl. No.: 09/504,004

(22) Filed: Feb. 14, 2000

(51) Int. Cl.[7] .................................................. G06F 1/32
(52) U.S. Cl. ................................... 712/1; 711/105
(58) Field of Search .......................... 711/105; 714/57, 714/24; 712/1

(56) References Cited

U.S. PATENT DOCUMENTS

| | | | | |
|---|---|---|---|---|
| 5,041,742 A | * | 8/1991 | Carbonaro | 326/97 |
| 5,867,036 A | * | 2/1999 | Rajsuman | 326/16 |
| 5,870,411 A | * | 2/1999 | Durham et al. | 714/724 |
| 6,091,261 A | * | 7/2000 | De Lange | 326/38 |
| 6,473,354 B2 | * | 10/2002 | Noda et al. | 365/227 |
| 6,483,363 B1 | * | 11/2002 | Karnik et al. | 327/211 |
| 6,529,861 B1 | * | 3/2003 | Patra et al. | 703/14 |

* cited by examiner

Primary Examiner—Eric Coleman
(74) Attorney, Agent, or Firm—Peter Lam

(57) ABSTRACT

A method and apparatus for scannable zero-catcher and one-catcher circuits. The catcher circuit of the present invention comprises an input stage. A feedback stage is coupled to the input stage. Scanning logic is coupled to the feedback stage. An output stage is coupled to the feedback stage.

30 Claims, 4 Drawing Sheets

US 6,697,929 B1

SCANNABLE ZERO-CATCHER AND ONE-CATCHER CIRCUITS FOR REDUCED CLOCK LOADING AND POWER DISSIPATION

FIELD OF THE INVENTION

The present invention relates generally to the field of integrated circuits and computer systems, and more specifically to scannable zero-catcher and one-catcher circuits.

BACKGROUND OF THE INVENTION

In recent years, the price of personal computers (PCs) has rapidly declined. As a result, more and more consumers have been able to take advantage of newer and faster machines. Users in both the business and home markets are now purchasing computers for a variety of uses. Numerous peripheral devices, expansion boards, and add-on cards are also available for system upgrades.

As the technology in computer systems improves, so has the complexity of the circuitry. This is especially true in the processor realm. The number of transistor devices present on a single silicon die has grown exponentially from only thousands in the 1980s to millions today. As the number of circuits and transistors increase, it becomes much more difficult for design engineers to test and debug such large circuits and integrated circuit devices.

During debug, engineers often try to take snapshots of the system or circuit that is under test. Such snapshots may provide some insight into the current state of the overall device or help narrow down a problem area. Engineers can evaluate this data and determine the cause of an error. In order to take read out the values of circuit nodes and signals, the circuit needs to have a way to send these values from latches or other storage devices in the circuit to the outside world.

However, not all integrated circuits are designed to include such testing support. Many of today's integrated circuits use some latch type memory mechanism to store data internally. These mechanisms do not provide a way for a user to read the contents or to send the contents out to a tester. Nor do these mechanisms allow a user to program or set these latches to a particular value.

BRIEF DESCRIPTION OF THE DRAWINGS

The present invention is illustrated by way of example and not limitations in the figures of the accompanying drawings, in which like references indicate similar elements, and in which.

DETAILED DESCRIPTION

A method and apparatus for scannable zero-catcher and one-catcher circuits are disclosed. The described scannable catcher circuits may be used as latch type memory mechanisms in integrated circuits, but have other applications as well. Although the following embodiments are described with reference to processors, other embodiments are applicable to other integrated circuits or logic devices. The same techniques and teachings of the present invention can easily be applied to other types of circuits or semiconductor devices that use scannable latch mechanisms.

A catcher circuit is a latch type mechanism. The scannable zero-catcher and one-catcher circuits are scannable memory elements that are used to latch monotonic signals. A monotonic signal is a signal that can transition in only one direction (high-to-low, or low-to-high) during a given time period. Monotonic signals are commonly found in CMOS (Complementary Metal Oxide Silicon) circuits at the outputs of dynamic (e.g., domino) circuitry.

Zero-catchers and one-catchers have inherent power dissipation advantages over standard latches or dynamic latch converters (DLC) because catchers have less capacitance switching at the clock frequency. Clock loading may also be lower when using a catcher circuit. The ability of catcher circuits to remain transparent to the evaluate edge even during the precharge clock phase makes catchers advantageous compared to traditional latches or dynamic latch converters in non-zero clock skew situations or where time borrowing techniques are applied.

In some integrated circuit designs, design engineers may want to make latching elements scannable for purposes such as testing or debug. The scannable zero-catchers and scannable one-catchers offer the additional capability of scanning the latch element. These scannable zero-catchers and one-catchers allow for the use of catcher circuits in an environment where scan is required.

Scannable catcher circuits can be used to replace catcher circuits and other types of latch mechanism that follow dynamic logic. Dynamic logic is a type of fast logic that can be found in synchronous systems. For instance, scannable catcher circuits can be included on integrated circuits on microprocessors, embedded processors, microcontrollers, or graphics devices. Embodiments of a scannable catcher circuit may lower power dissipation, allow for a large transparency window in a latching stage following dynamic logic, and assist in testing/debug procedures.

Figure 1:
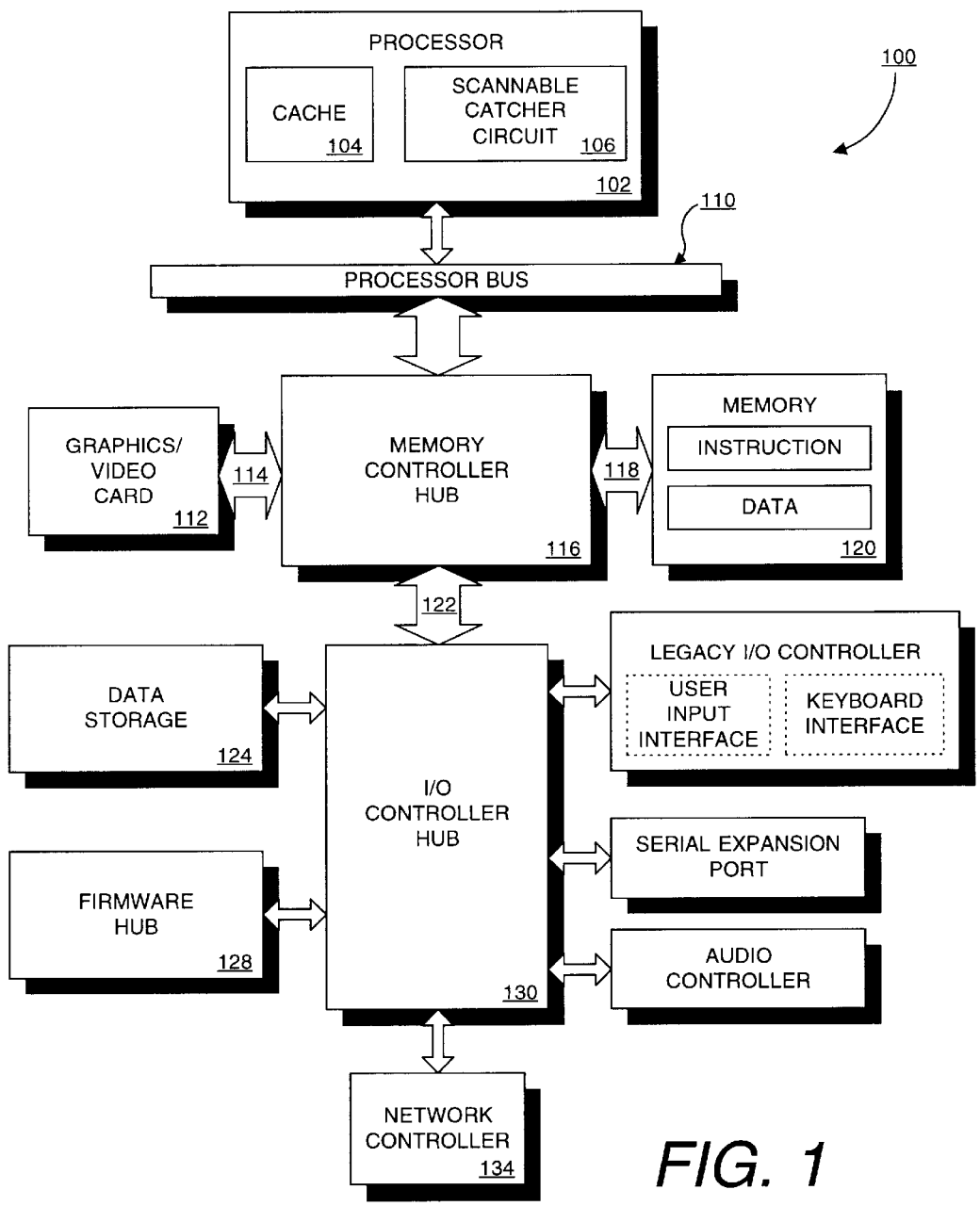
FIG. 1 is a computer system including a scannable catcher.

Referring now to FIG. 1, a computer system 100 is shown. System 100 uses a memory that incorporates a gate enhancement charge pump such as that of one embodiment described herein. System 100 is representative of processing systems based on the PENTIUM®, PENTIUM® Pro, PENTIUM® II, PENTIUM® III microprocessors available from Intel Corporation of Santa Clara, Calif., although other systems (including PCs having other microprocessors, engineering workstations, set-top boxes and the like) may also be used. Thus, the present invention is not limited to any specific combination of hardware circuitry and software.

Alternative embodiments of the present invention can be used in devices such as, for example, handheld devices and embedded applications. Some examples of handheld devices include cellular phones, Internet Protocol devices, digital cameras, personal digital assistants (PDAs), and handheld PCs. Embedded applications can include a microcontroller, a digital signal processor (DSP), system on a chip, network computers (NetPC), set-top boxes, network hubs, wide area network (WAN) switches, or any other system which uses a latch type mechanism for other embodiments.

FIG. 1 is a block diagram of one embodiment of a system 100. The computer system 100 includes a processor 102 that processes data signals. It is understood that other embodiments may alternatively be implemented as systems having multiple processors. Processor 102 is coupled to a processor bus 110 that transmits data signals between processor 102 and other components in the system 100. The elements of system 100 perform their conventional functions well known in the art.

System 100 includes a memory 120. Memory 120 may be a dynamic random access memory (DRAM) device, a static random access memory (SRAM) device, flash memory device, or other memory device. A cache memory 104 can reside inside processor 102 that stores data signals stored in memory 120. Alternatively, in another embodiment, the cache memory may reside external to the processor. A scannable catcher circuit 106 also resides in processor 102. Alternate embodiments of a scannable catcher circuit 106 can also be used in microcontrollers, embedded processors, graphics devices, DSPs, and other types of logic circuits.

A system logic chip 116 is coupled to the processor bus 110 and memory 120. The processor 102 communicates to a memory controller hub (MCH) 116 via a processor bus 110. The MCH 116 provides a high bandwidth memory path 118 to memory 120 for instruction and data storage and for storage of graphics commands, data and textures. The MCH 116 directs data signals between processor 102, memory 120, and other components in the system 100 and bridges the data signals between processor bus 110, memory 120, and system I/O 122. The graphics card 112 is coupled to the MCH 116 through an Accelerated Graphics Port (AGP) interconnect 114.

System 100 uses a proprietary hub interface bus 122 to couple the MCH 116 to the I/O controller hub (ICH) 130. The ICH 130 provides direct connections to I/O devices. Some examples of these I/O devices are the audio controller, firmware hub 128, data storage 124, legacy I/O controller containing user input and keyboard interfaces, a serial expansion port such as Universal Serial Bus (USB), and a network controller 134. The data storage device 124 can comprise, for example, a hard disk drive, a floppy disk drive, a CD-ROM device, a flash memory device, or a mass storage device.

Figure 2:
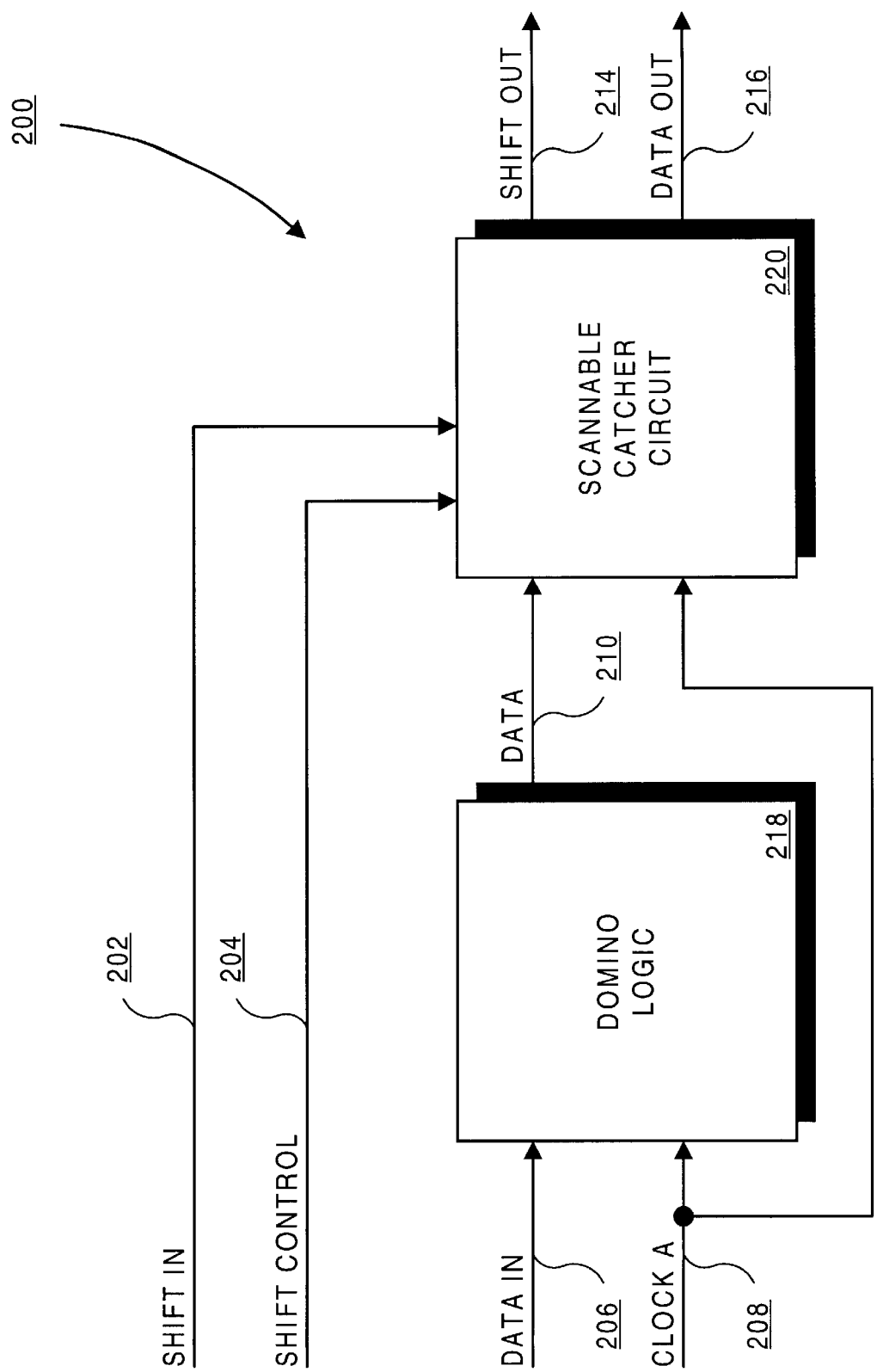
FIG. 2 is a block diagram of one embodiment of a logic circuit including a scannable catcher.

FIG. 2 is a block diagram of one embodiment of a logic circuit 200 including a scannable catcher. Logic circuit 200 comprises of two main blocks of circuitry: domino logic 218 and scannable catcher circuit 220. Both circuit blocks 218 and 220 are clocked with the same clock signal CLOCK A 208. In one embodiment, the low phase of the clock is a precharge period whereas the high phase is an evaluate period. However, separate or different clock signals can be used to clock the circuit blocks 218 and 220.

The first block is a domino logic circuit 218. For this example, domino logic 218 is used. However, other embodiments of a scannable catcher 220 are not limited to domino logic 218. For alternative embodiments, other types of dynamic logic and other synchronous systems can be used. An input on DATA IN 206 is fed into domino logic 218. The domino logic 218 performs operations based on inputs received on DATA IN 206 and generates an output to DATA 210. DATA 210 is coupled to a scannable catcher circuit 220 operating as a latch type mechanism.

The scannable catcher circuit 220 can be a one-catcher or a zero-catcher depending on the specific circuit implementation and the polarity of the input on DATA 210. The scannable catcher circuit 220 is latches its input 210 and drives the latched value on its output DATA OUT 216. Furthermore, the catcher circuit 220 has a scan capability. Other inputs to this scannable catcher circuit 220 include SHIFT IN 202 and SHIFT CONTROL 204. SHIFT CONTROL 204 controls whether the catcher 220 operates in a normal mode or in a scan mode. During normal mode, the catcher 220 performs as a simple clocked latch. The data inputted to the catcher is latched internally based on the correct clock edge. The latched value is outputted on DATA OUT 216. In one embodiment, an inverted version of the latched value is outputted on SHIFT OUT 214. During scan mode, a user can use SHIFT IN 202 to drive a particular data value into catcher circuit 220. The latched value in the catcher circuit 220 can then be shifted out on SHIFT OUT 214 and read.

During circuit testing or debug of an integrated circuit, a user may wish to determine the state of the circuitry. An integrated circuit device including scannable catchers can assist in this process. Multiple instantiations of the logic circuit 200 can be daisy chained in series with each other in an integrated circuit device. For example, the DATA OUT 216 of a first scannable catcher circuit 220 can be connected to the DATA IN 206 of a second domino logic block. Similarly, the SHIFT OUT 214 of a first catcher circuit can be connected to the SHIFT IN 202 of a second catcher circuit 220. The SHIFT OUT 214 of the last, or second in this case, catcher 220 can be coupled to an output pin on the integrated device.

If a user wishes to read out the latched contents at a particular point in time, the user first stops or disables the clock signal 208. In one embodiment, the clock 208 is disabled to a precharge state. The domino logic 218 of this example has also been designed to drive a precharge value to the input of the catcher 220 when the clock 208 is at a precharge state. The scannable catcher circuits 220 are switched into scan mode by toggling SHIFT CONTROL 204. The latched value in the first catcher 220 is propagated on its SHIFT OUT 214 into the second catcher 220. Meanwhile, the latched value of the second catcher 220 is driven out to the output pin. The user can read or log that value. As SHIFT CONTROL 204 is toggled off, the catchers 220 revert to a normal mode. The value that was driven on SHIFT OUT 214 from the first catcher 220 to the second catcher 220 is now latched in the second catcher. This value is now also driven out from the second catcher on DATA OUT 216 and SHIFT OUT 214. Since the SHIFT OUT 214 of the second catcher is coupled to an output pin, the user can now read the latched contents of the first catcher 220. By repeating these steps to shift the catcher contents out to a data pin, a user can take a snapshot of the latched values in the catcher circuits. This snapshot can be helpful during testing and debug evaluations.

A user may also be able to configure the latched contents of the scannable catcher circuits. For another embodiment, SHIFT IN 202 of the first catcher 220 can be coupled to an input pin on the integrated circuit device. By toggling the catchers 220 into scan mode, the user can drive a first value on the input pin and into the first catcher 220 via SHIFT IN 202. As the catchers 220 are returned to normal mode, the first value is latched and driven to the second catcher 220. A second value can then be programmed into the first catcher 220 by triggering the scan mode again. By repeating these steps, a user can set the contents of the catcher circuits 220 to desired values and possibly restart operation of the integrated circuit device or relevant circuits.

Figure 3:
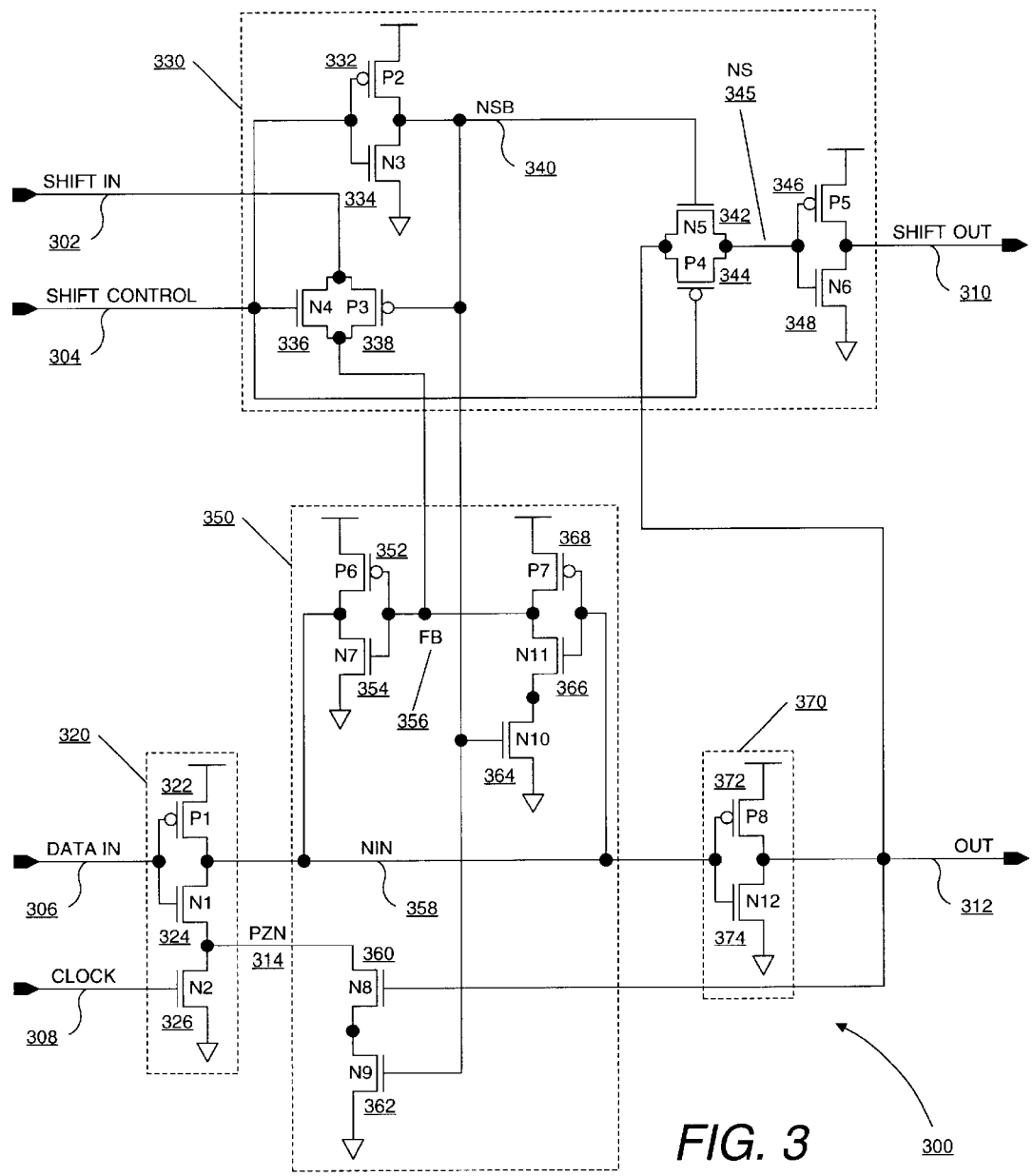
FIG. 3 is a circuit diagram of one embodiment of a scannable zero-catcher.

FIG. 3 is a circuit diagram of one embodiment of a scannable zero-catcher 300. The scannable zero-catcher 300 comprises of four sections: an input stage 320, scanning logic 330, a latch (feedback) stage 350, and an output stage 370. In one embodiment, the zero-catcher 300 is controlled with four signals: SHIFT IN 302, SHIFT CONTROL 304, DATA IN 306, and CLOCK 308. SHIFT OUT 310 and OUT 312 are the two outputs provided from the zero-catcher 300 of this embodiment.

DATA IN 306 denotes the data signal that is to be latched by the zero-catcher 300. CLOCK 308 refers to a synchronizing signal that is used to control the zero-catcher 300 and the upstream dynamic logic (e.g. domino logic 218 of FIG. 2). In one embodiment, CLOCK 308 has two phases, high (evaluate) and low (precharge). DATA IN 306 is assumed to be a monotonic signal such as would be seen at the output of a dynamic circuit. That is, during the high (evaluate) phase of CLOCK 308, DATA IN 306 initially begins in the high state and may make a high-to-low transition or may stay high, but cannot make a low-to-high transition. During the low (precharge) phase of CLOCK 308, DATA IN 306 is precharged back to its starting high level. Due to intentional or unintentional clock skew, a high-to-low transition on DATA IN 306 may occur early during the low clock phase.

The input stage 320 accepts the DATA IN 306 and CLOCK 308 signals. A P type field effect transistor P1 322 is coupled in series with N type field effect transistors N 1 324, N2 326 to form an inverter type structure. The source terminal of P1 322 is connected to a VCC supply voltage. The gate terminals of P1 322 and N1 324 are connected together to input signal DATA IN 306. The drain terminals of P1 322 and N1 324 are also connected together at node NIN 358. The source terminal of N1 324 is coupled to the drain terminal of N2 326 at node PZN 314. CLOCK 308 drives the gate terminal of N2 326. A ground potential is connected to the source terminal of N2 326.

SHIFT CONTROL 304 is a signal used to control the scanning operation of the scannable zero-catcher 300. During normal operation, SHIFT CONTROL 304 would be low. During the scanning operation (described below), SHIFT CONTROL 304 will alternate between high and low.

The scanning logic stage 330 of the zero-catcher 300 accepts signals SHIFT IN 302 and SHIFT CONTROL 304. SHIFT CONTROL 304 is connected to the gate terminals of P2 332 and N3 334. The source terminal of P2 332 is connected to VCC and the drain terminal is connected to the drain terminal of N3 334 at node NSB 340. Source terminal of N3 334 is connected to ground. The logic signal on node NSB 340 is an inverted version of signal SHIFT CONTROL 304. SHIFT IN 302 is connected to the drain terminals of a pair of pass devices N4 336, P3 338. The pass devices control the passage of the data value on SHIFT IN 302 to the latch mechanism in the latch (feedback) stage 350. The gate terminal of N4 336 is connected to SHIFT CONTROL 304 and the gate terminal of P3 338 is connected to NSB 340. The source terminals of N4 336 and P3 338 are connected together at node FB 356 as the output of the pass devices.

A second pair of pass devices N5 342, P4 344 are controlled by SHIFT CONTROL 304. The gate terminal of N5 342 is connected to NSB 340 and the gate terminal is connected to SHIFT CONTROL 304. The drain terminals of N5 342 and P4 344 are connected together as an input to received the OUT 312 signal. The output of the pass devices is formed at node NS 345 with the source terminals of N5 342 and P4 344. This output is connected to the gate terminals of P5 346 and N6 348. The source terminal of P5 346 is connected to VCC whereas the source terminal of N6 348 is connected to ground. The drain terminals of P5 346 and N6 348 are coupled together to output SHIFT OUT 310. SHIFT OUT 310 in this example is an inverted version of OUT 312.

The latch or feedback stage 350 is the latch type mechanism of the scannable zero-catcher circuit 300. Field effect transistors P7 368, N11 366, and N10 364 are connected in series to form an inverter type structure. The gate terminals of P7 368 and N11 366 are connected together as the input of an inverter at node NIN 358. The source terminal of P7 368 is connected to VCC. The source terminal of N11 366 is connected to the drain terminal of N10 364. The source terminal of N10 364 is connected to ground. The output of the inverter is formed at the connection of the drain terminals of P7 368 and N11 366 at node FB 356. The gate terminal of N10 364 is connected to node NSB 340, which is the inverted version of SHIFT CONTROL 304.

Also connected to node FB 356 is the input of the inverter formed by P6 352 and N7 354. The gate terminals of P6 352 and N7 354 are connected together at node FB 356. The source terminal of P6 352 is connected to VCC and the source terminal of N7 354 connected to ground. The drain terminals of P6 352 and N7 354 are connected together as the output of the inverter at node NIN 358.

A feedback loop is formed from node NIN 358 through a first inverter formed by P7 368 and N11 366, to node FB 356, through a second inverter formed by P6 352, and N7 354, and back to node NIN 358.

N type field effect transistors N8 360 and N9 362 are also part of the feedback stage 350. The drain terminal of N8 360 is connected to the drain terminal of N2 326 and the source terminal of N1 324. The gate terminal of N8 360 is connected to output node OUT 312. The source terminal of N8 360 is connected to the drain terminal of N9 362. The gate terminal of N9 362 is connected to node NSB 340 and the source terminal of N9 362 is connected to ground.

The output stage 370 is an inverter formed with P8 372 and N12 374. The gate terminals of P8 372 and N12 374 are connected together as the input of the inverter and receive a signal from the latch stage on node NIN 358. The source terminal of P8 372 is connected to VCC whereas the source terminal of N12 374 is connected to ground. The drain terminals of P8 372 and N12 374 are coupled together to output OUT 312.

During normal operation, the scannable zero-catcher 300 will "catch" and latch any low value of DATA IN 306 and hold it until the next high clock phase. The low value of DATA IN 306 is propagated into the scannable zero-catcher 300 via transistor P1 322. If DATA IN 306 remains high, that high value will propagate through transistor N1 324 into the scannable zero-catcher 300 during the high clock phase. Transistor N2 326 serves to block the propagation of a high DATA IN 306 during the low phase of CLOCK 308. The latching mechanism is implemented via transistors P6 352, N7 354, P7 368, and N11 366, which form a latching feedback loop from node NIN 358 to node FB 356 back to NIN 358. Transistors P8 372 and N12 374 serve as an inverter that isolates the memory node NIN 358 from the output node OUT 312. Transistor N8 360 serves as additional feedback to counteract noise, but is not required in alternative embodiments.

The scan operation may be implemented in a number of different fashions and may use a different control signal protocol than demonstrated here. FIG. 3 is one example of how scanning can be added to a zero-catcher 300. In this example, in order to make the zero-catcher 300 scannable, transistors P2 332, N3 334, P3 338, N4 336, P4 344, N5 342, P5 346, N6 348, N10 364, and N9 362 are added. Scannability, as implemented in this example, works as follows. During normal operation, SHIFT CONTROL 304 is low, the input to the scannable zero-catcher 300 is being taken from DATA IN 306, and the output of the scanning logic 330 is being delivered node NS 345, which is being delivered node OUT 312 through the open transmission gate composed of transistors N5 342 and P344, and then inverted and outputted as SHIFT OUT 310.

When a scan operation is to be performed, CLOCK 308 will be set low, and SHIFT CONTROL 304 will be driven high. This action will close the transmission gate composed of transistors N5 342 and P4 344 and open the transmission gate of N4 336 and P3 338, allowing the value of SHIFT IN 302 rather than DATA IN 306 to be latched within the scannable zero-catcher 300. The value of SHIFT IN 302 can thus overwrite the previously latched value. Transistors N10 364 and N9 362 function to disable and break the feedback loop during a "shift in" operation to eliminate the drive fight between the feedback loop and the driver of SHIFT IN 302. When SHIFT CONTROL 304 is driven low, the transmission gate of N4 336 and P3 338 will close and the transmission gate of N5 342 and P4 344 will reopen, effectively shifting the data on SHIFT IN 302 to SHIFT OUT 310 in a synchronous manner. The feedback loop of this embodiment is enabled when SHIFT CONTROL 304 is driven low.

Figure 4:
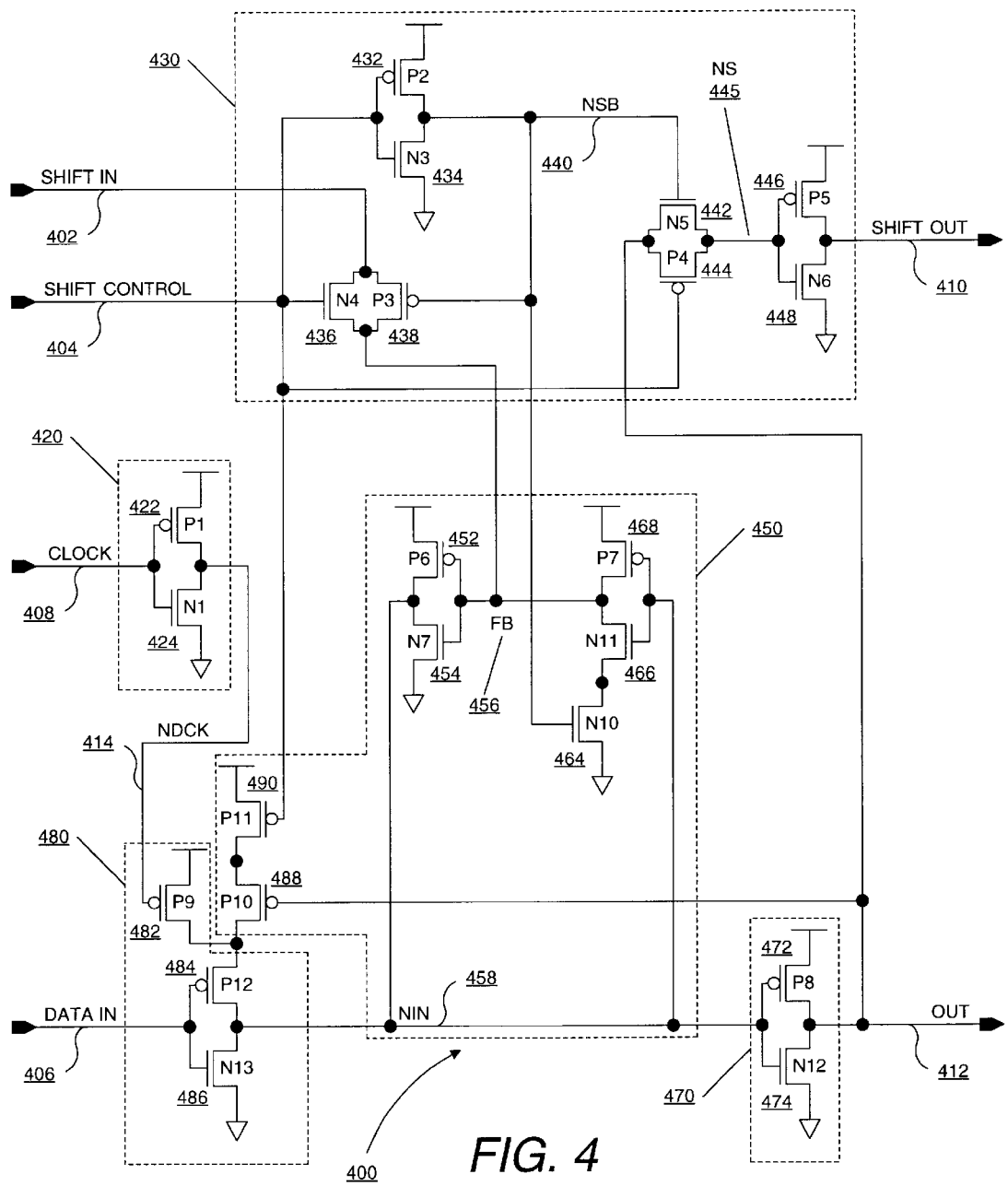
FIG. 4 is a circuit diagram of one embodiment of a scannable one-catcher.

FIG. 4 is a circuit diagram of one embodiment of a scannable one-catcher 400. The scannable one-catcher 400 of this embodiment comprises of five sections: a clock inversion stage 420, an input stage 480, scanning logic 430, a latch (feedback) stage 450, and an output stage 470. In one embodiment, the one-catcher 400 is controlled with four signals: SHIFT IN 402, SHIFT CONTROL 404, DATA IN 406, and CLOCK 408. SHIFT OUT 410 and OUT 412 are the two outputs provided from the one-catcher 400 of this embodiment. The structure of this one-catcher 400 is similar to that of the zero-catcher 300 of FIG. 3.

The clock inversion stage 420 is an inverter constructed with P type field effect transistor P1 422 and N type field effect transistor N1 424. The gate terminals of P1 422 and N1 424 are connected together as the input of the inverter and receive clock signal CLOCK 408. The source terminal of P1 422 is connected to VCC whereas the source terminal of N1 424 is connected to ground. The drain terminals of P1 422 and N1 424 are coupled together to form inverter output NDCK 414.

The input stage 480 accepts the DATA IN 406 signal. P type field effect transistor P12 484 is coupled in series with N type field effect transistor N13 486 to form an inverter type structure. The source terminal of P12 484 is connected to the drain terminal of P10 488 and the drain terminal of P9 482. The gate terminal of P9 482 is connected to the inverted CLOCK signal 408 at node NDCK 414 and the source terminal of P9 482 is connected to VCC. The gate terminals of P12 484 and N13 486 are connected together to input signal DATA IN 406. The drain terminals of P12 484 and N13 486 are also connected together at node NIN 458. A ground potential is connected to the source terminal of N13 486.

The scanning logic stage 430 of the one-catcher 400 accepts signals SHIFT IN 402 and SHIFT CONTROL 404. SHIFT CONTROL 404 is connected to the gate terminals of P2 432 and N3 434. The source terminal of P2 432 is connected to VCC and the drain terminal is connected to the drain terminal of N3 434 at node NSB 440. Source terminal of N3 434 is connected to ground. The logic signal on node NSB 440 is an inverted version of signal SHIFT CONTROL 404. SHIFT IN 402 is connected to the drain terminals of a pair of pass devices N4 436, P3 438. The pass devices control the passage of the data value on SHIFT IN 402 to the latch mechanism in the latch (feedback) stage 450. The gate terminal of N4 436 is connected to SHIFT CONTROL 404 and the gate terminal of P3 438 is connected to NSB 440. The source terminals of N4 436 and P3 438 are connected together at node FB 456 as the output of the pass devices.

A second pair of pass devices N5 442, P4 444 is controlled by SHIFT CONTROL 404. The gate terminal of N5 442 is connected to NSB 440 and the gate terminal of P4 444 is connected to SHIFT CONTROL 404. The drain terminals of N5 442 and P4 444 are connected together as an input to receive the OUT 412 signal. The output of the pass devices is formed at node NS 445 with the source terminals of N5 442 and P4 444. This output is connected to the gate terminals of P5 446 and N6 448. The source terminal of P5 446 is connected to VCC whereas the source terminal of N6 448 is connected to ground. The drain terminals of P5 446 and N6 448 are coupled together to output SHIFT OUT 410. SHIFT OUT 410 in this example is an inverted version of OUT 412.

The latch or feedback stage 450 is the latch type mechanism of the scannable one-catcher circuit 400. Field effect transistors P7 468, N11 466, and N10 464 are connected in series to form an inverter type structure. The gate terminals of P7 468 and N11 466 are connected together as the input of an inverter at node NIN 458. The source terminal of P7 468 is connected to VCC. The source terminal of N11 466 is connected to the drain terminal of N10 464. The source terminal of N10 464 is connected to ground. The output of the inverter is formed at the connection of the drain terminals of P7 468 and N11 466 at node FB 456. The gate terminal of N10 464 is connected to node NSB 440, which is the inverted version of SHIFT CONTROL 404.

Also connected to node FB 456 is the input of the inverter formed by P6 452 and N7 454. The gate terminals of P6 452 and N7 454 are connected together at node FB 456. The source terminal of P6 452 is connected to VCC and the source terminal of N7 454 connected to ground. The drain terminals of P6 452 and N7 454 are connected together as the output of the inverter at node NIN 458.

A feedback loop is formed from node NIN 458 through a first inverter formed by P7 468 and N11 466, to node FB 456, through a second inverter formed by P6 452, and N7 454, and back to node NIN 458.

P type field effect transistor P10 488 and P11 490 are also part of the feedback stage. P11 490, P10 488, and P12 484 are coupled in series with N type field effect transistor N13 486. The source terminal of P11 490 is connected to a VCC supply voltage. The gate terminal of P11 490 is connected to SHIFT CONTROL 404 and the drain terminal is connected to the source terminal of P10 488. The drain terminal of P10 488 is connected to the source terminal of P12 484 and the drain terminal of P9 482. The gate terminal of P10 488 is connected to OUT 412.

The output stage 470 is an inverter formed with P8 472 and N12 474. The gate terminals of P8 472 and N12 474 are connected together as the input of the inverter and receive a signal from the latch stage on node NIN 458. The source terminal of P8 472 is connected to VCC whereas the source terminal of N12 474 is connected to ground. The drain terminals of P8 472 and N12 474 are coupled together to output OUT 412.

Operation of this scannable one-catcher 400 is similar to the scannable zero-catcher 300 of FIG. 3. The scannable one-catcher 400 is used when the DATA IN 406 signal is the inverse of that described for the scannable zero-catcher 300. That is, during the high (evaluate) phase of CLOCK 408, DATA IN 406 initially begins in the low state and may make a low-to-high transition or may stay low, but cannot make a high-to-low transition. During the low (precharge) phase of CLOCK 408, DATA IN 406 will be precharged back to its starting low level. The inverter formed by transistors P1 422 and N1 424 allows the scannable one-catcher 400 to take the same polarity clock signal as upstream conventional domino dynamic logic, but may not be necessary in other embodiments.

In the foregoing specification, the invention has been described with reference to specific exemplary embodiments thereof. It will, however, be evident that various modifications and changes may be made thereof without departing from the broader spirit and scope of the invention as set forth in the appended claims. The specification and drawings are, accordingly, to be regarded in an illustrative rather than a restrictive sense.

What is claimed is:

1. A catcher circuit comprising:
    an input stage to receive a monotonic signal and a clock signal to control evaluation of said monotonic signal, said monotonic signal enabled to transition during an evaluate phase of said clock signal and said monotonic signal to precharge during a precharge phase of said clock signal;
    a feedback stage coupled to the input stage, said feedback stage to latch a first data value from said input stage;
    scanning logic coupled to the feedback stage; and
    an output stage coupled to the feedback stage.

2. The catcher circuit of claim 1 wherein the input stage, the feedback stage, the scanning logic, and the output stage operate together as a zero-catcher.

3. The catcher circuit of claim 1 wherein the input stage, the feedback stage, the scanning logic, and the output stage operate together as a one-catcher.

4. The catcher circuit of claim 1 wherein the feedback stage comprises two inverters connected in series.

5. The catcher circuit of claim 1 wherein the feedback stage is a latch.

6. The catcher circuit of claim 1 wherein the scanning logic further comprises a pass device to receive a second data value.

7. The catcher circuit of claim 6 wherein the pass device propagates the second data value to the output stage.

8. The catcher circuit of claim 1 further comprising a control signal to activate the scanning logic.

9. The catcher circuit of claim 8 wherein the control signal disables the feedback stage and overwrites the first data value latched in the feedback stage.

10. A processor comprising:
    an execution unit;
    a bus coupled to the execution unit;
    dynamic logic coupled to the execution unit;
    a scannable catcher circuit coupled to the dynamic logic, said scannable catcher circuit to receive a monotonic signal and a clock signal to control evaluation of said monotonic signal, said monotonic signal enabled to transition during an evaluate phase of said clock signal and said monotonic signal to precharge during a precharge phase of said clock signal; and
    an external pin coupled to the scannable catcher circuit.

11. The processor of claim 10 wherein the scannable catcher circuit is a zero-catcher.

12. The processor of claim 10 wherein the scannable catcher circuit is a one-catcher.

13. The processor of claim 10 wherein the dynamic logic comprises domino logic.

14. The processor of claim 10 wherein the external pin is a data output pin.

15. The processor of claim 10 wherein the external pin is a data input pin.

16. A digital processing system comprising:
    a bus;
    a memory coupled to the bus;
    an integrated circuit device coupled to the memory, the integrated circuit device comprising
        dynamic logic; and
        a scannable catcher circuit coupled to said dynamic logic, said scannable catcher circuit to receive a monotonic signal and a clock signal to control evaluation of said monotonic signal, said monotonic signal enabled to transition during an evaluate phase of said clock signal and said monotonic signal to precharge during a precharge phase of said clock signal.

17. The digital processing system of claim 16 wherein the dynamic logic comprises domino logic.

18. The digital processing system of claim 16 wherein the scannable catcher circuit is a zero-catcher.

19. The digital processing system of claim 16 wherein the scannable catcher circuit is a one-catcher.

20. The digital processing system of claim 16 wherein the integrated circuit device comprises a processor.

21. The digital processing system of claim 16 wherein the integrated circuit device comprises a microcontroller.

22. The digital processing system of claim 16 wherein the integrated circuit device comprises a graphics circuit.

23. A method of scanning a catcher circuit comprising:
    disabling a clock signal to the catcher circuit;
    enabling a shift control to a scan circuit;
    shifting a first data value into a feedback stage;
    disabling the shift control and latching the first data value into the feedback stage; and
    outputting the first data value from the catcher circuit.

24. The method of claim 23 wherein the outputting comprises propagating the first data value to dynamic logic.

25. The method of claim 23 wherein the outputting comprises propagating the first data value to static logic.

26. The method of claim 23 wherein the outputting comprises propagating the first data value to a scan circuit of a second catcher circuit.

27. The method of claim 23 wherein enabling a shift control activates a scan mode.

28. The method of claim 23 wherein disabling a shift control activates a normal mode.

29. The method of claim 23 further comprising disabling a feedback loop in the feedback stage.

30. The method of claim 23 wherein the first data value is outputted to a data pin on an integrated circuit device.

* * * * *